United States Patent
Lin et al.

(10) Patent No.: US 6,753,569 B2
(45) Date of Patent: Jun. 22, 2004

(54) METHOD TO FABRICATE A NON-SMILING EFFECT STRUCTURE IN SPLIT-GATE FLASH WITH SELF-ALIGNED ISOLATION

(75) Inventors: Yai-Fen Lin, Non-Tour (TW); Chang Song Lin, Hsin-Chu (TW); Chia-Ta Hsieh, Tainan (TW); Hung-Cheng Sung, Hsin-chu (TW); Juang-Ke Yeh, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/029,622

(22) Filed: Dec. 31, 2001

(65) Prior Publication Data

US 2002/0055205 A1 May 9, 2002

Related U.S. Application Data

(62) Division of application No. 09/292,360, filed on Apr. 15, 1999, now Pat. No. 6,358,796.

(51) Int. Cl.$^7$ .............................................. H01L 29/76
(52) U.S. Cl. ........................ 257/314; 257/315; 257/316
(58) Field of Search ............................... 257/314–316, 257/317, 318, 319, 320, 321, 322, 506, 524

(56) References Cited

U.S. PATENT DOCUMENTS

| | | | | |
|---|---|---|---|---|
| 4,631,803 A | * | 12/1986 | Hunter et al. | 148/DIG. 117 |
| 5,231,299 A | * | 7/1993 | Ning et al. | 257/316 |
| 5,447,884 A | | 9/1995 | Fahey et al. | 437/67 |
| 5,597,751 A | | 1/1997 | Wang | 437/43 |
| 5,652,161 A | | 7/1997 | Ahn | 437/43 |
| 5,851,881 A | * | 12/1998 | Lin et al. | 438/261 |
| 6,013,551 A | * | 1/2000 | Chen et al. | 438/264 |

* cited by examiner

Primary Examiner—Kevin M. Picardat
(74) Attorney, Agent, or Firm—George O. Saile; Stephen B. Ackerman

(57) ABSTRACT

A method is provided for forming a split-gate flash memory cell having a shallow trench isolation without the intrusion of a "smiling" gap near the edge of the trench encompassing the first polysilicon layer. This is accomplished by forming two conformal layers lining the interior walls of the trench. An exceptionally thin nitride layer overlying the first conformal oxide layer provides the necessary protection during the oxidation of the first polysilicon layer so as to prevent the "smiling" effect normally encountered in fabricating ultra large scale integrated circuits.

9 Claims, 4 Drawing Sheets

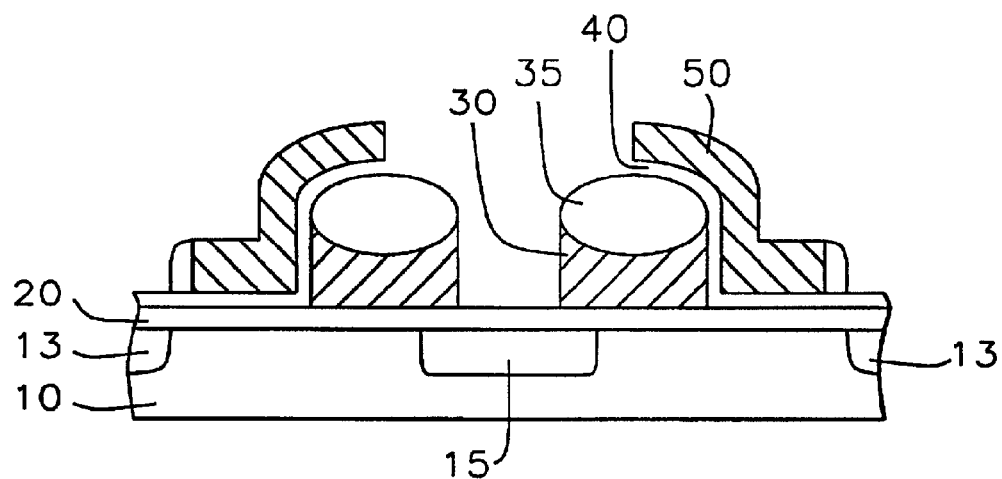
FIG. 1A – Prior Art
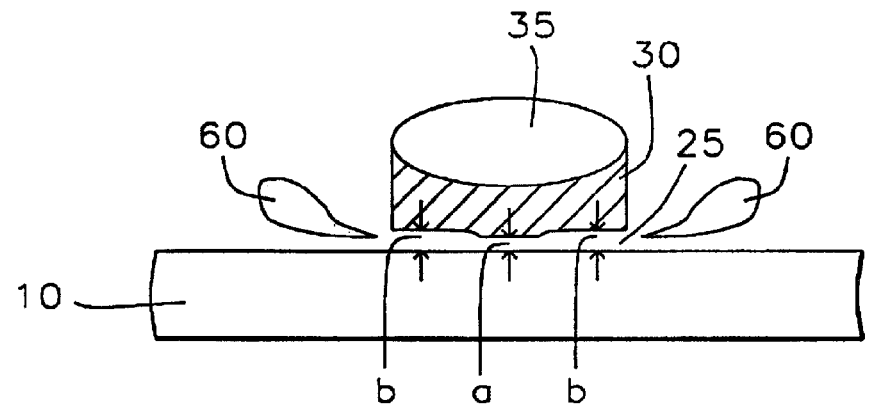
FIG. 1B – Prior Art
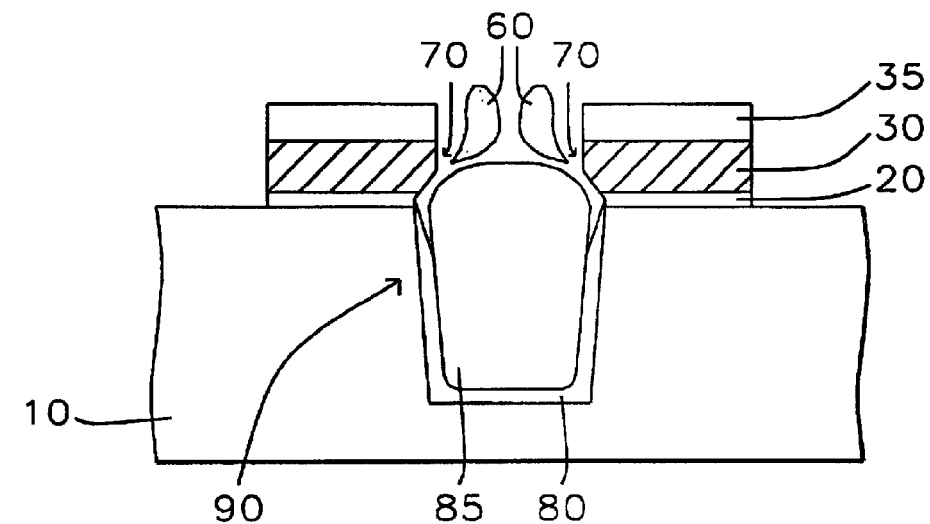
FIG. 1C – Prior Art

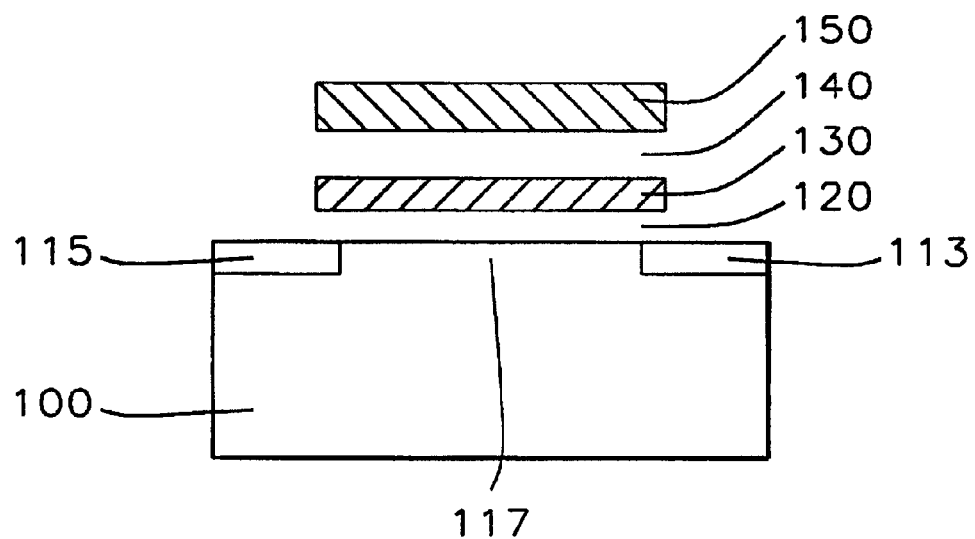
FIG. 2A – Prior Art
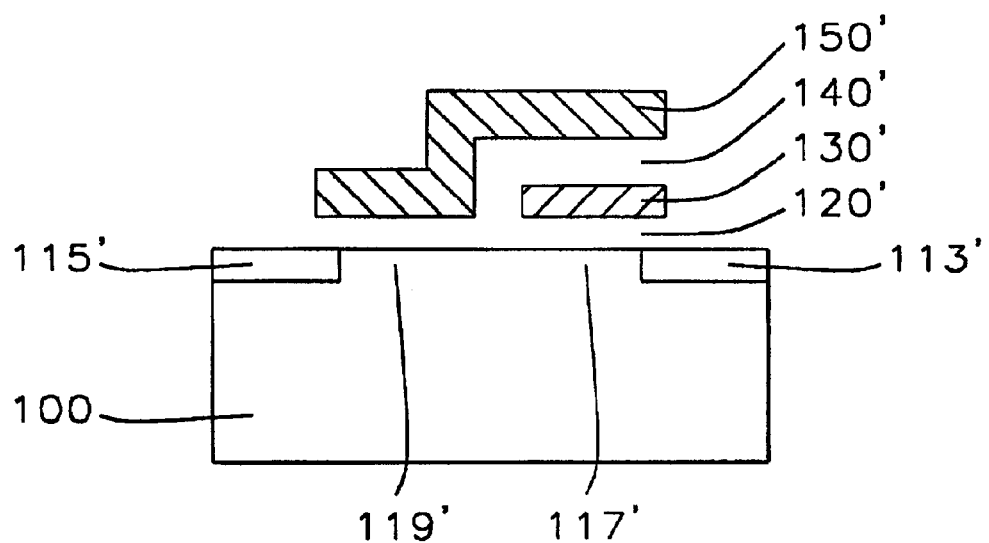
FIG. 2B – Prior Art

METHOD TO FABRICATE A NON-SMILING EFFECT STRUCTURE IN SPLIT-GATE FLASH WITH SELF-ALIGNED ISOLATION

This is a division of patent application Ser. No. 09/292,360, filing date Apr. 15, 1999 now U.S. Pat. No. 6,358,796, A Method To Fabricate A Non-Smiling Effect Structure In Split-Gate Flash With Self-Aligned Isolation, assigned to the same assignee as the present invention.

BACKGROUND OF THE INVENTION (1) Field of the Invention

The present invention relates to the manufacturing of semiconductor memories, and in particular, directed to a split-gate flash memory having a shallow trench isolation with a "non-smiling" structure and to a method of forming the same.

(2) Description of the Related Art

The conventional split-gate flash memory cell of FIG. 1a, as practiced in the present manufacturing line, is found to exhibit relatively small capacitive coupling and low data retention capability. This is because, the relatively thick gate oxide (20) separating the floating gate (30) from the substrate (10) contributes to the reduced coupling between the floating gate (30) and the source (15) due to the so-called "smiling effect". Reference numerals (13) refer to the drain regions in the cell. Smiling effect occurs at the edge of the floating gate which can be better seen in the enlarged view in FIG. 1b. As is known in the art, floating gate (30) is separated from substrate (10) by the intervening gate oxide layer (20) and from the control gate (50) by the intervening intergate oxide (40) layer as shown in FIG. 1a. Floating gate, including the overlying polyoxide (35) "cap", and the "smiling" structure are shown in FIG. 1b.

"Smiling" effect refers to the thickening of the edges (25), or "lips" of the gate oxide underlying the polysilicon floating gate of a memory cell caused—as will be apparent to those skilled in the art—by the diffusion of oxygen (60) during the forming of the polyoxide (35) over the gate as shown in FIG. 1b. That is, during oxidation, oxygen (60) diffuses into the gate (30) as well as into gate oxide (20) through its edges (25) and grows the edges as shown in FIG. 1b. Hence the thickness (b) at edge (25) becomes larger than its original thickness (a), thereby resulting in a structure having a "smiling" effect.

The same "smiling" effect is found in the prior art of shallow trench isolation (STI) as shown in FIG. 1c as well. Trench (90) depicted in FIG. 1c is lined with an oxide layer (80) prior to being filled with isolation oxide (85). Because oxygen (60) diffuses also readily in oxide, a "smiling" effect develops at edges (70) forming large "lips" as shown in FIG. 1c. The thickness and shape of the edge "lips" play an important role in the data retention and the coupling between the gate and the source of a memory cell as will be described more fully below. It is disclosed in this invention a "non-smiling" memory cell structure with a self-aligned STI and a method to form the same. It is further disclosed that the method used provides smaller devices which in turn increase the scale of integration of semiconductor chips.

The importance of data retention capacity and the coupling between the gate and the source of a memory cell has been well recognized since the advent of the one-transistor cell memory cell with one capacitor. Over the years, many variations of this simple cell have been advanced for the purposes of shrinking the size of the cell and, at the same time, improve its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stack-gate structure and a split-gate structure. A conventional stack-gate type cell is shown in FIG. 2a where, as is well known, tunnel oxide film (120), a floating gate (130), an interpoly insulating film (140) and a control gate (150) are sequentially stacked on a silicon substrate (100) between a drain region (113) and a source region (115) separated by channel region (117). Substrate (100) and channel region (117) are of a first conductivity type, and the first (113) and second (115) doped regions are of a second conductivity type that is opposite the first conductivity type.

One of the problems that is encountered in flash memories is the "over-erasure" of the memory cell contents during erasure operations. As seen in FIG. 2a, the stacked-gate transistor is capable of injecting electrons from drain (113), based on a phenomenon known as the Fowler-Nordheim Tunneling Effect, through tunneling oxide layer (120) into floating gate (130). The threshold voltage of a stacked-gate transistor can be raised by means of such electron injection, and the device is then assumes a first state that reflect the content of the memory cell. On the other hand, during erasure of the memory cell, electrons are expelled from the source (115) through tunneling oxide layer (120) and out of floating gate (130) of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the stacked-gate transistor becomes a depletion transistor, which conducts even in the absence of the application of a control voltage at the control gate, (150). This phenomenon is known in the art as memory over-erasure.

To overcome the described memory over-erasure problem of stacked-gate type EEPROM devices, a split-gate EEPROM device is used as shown in FIG. 2b. This memory device comprises floating-gate transistor which similarly includes control gate (150'), floating gate (130') as in the case of the stacked-gate transistor of FIG. 2a. However, floating gate (130') here covers only a portion of the channel region, (117'), and the rest of the channel region, (119'), is directly controlled by control gate (150'). This split-gate-based memory cell is equivalent to a series connected floating-gate transistor (117') and an enhanced isolation transistor (119'), as is schematically represented in FIG. 2b. The principal advantage of such configuration is that isolation transistor (119') is free from influence of the state of floating gate (117') and remains in its off-state, even if floating-gate transistor (117') is subjected to the phenomenon of over-erasure and therefore, is in a conductive state. The memory cell can thus maintain its correct state irrespective of the over-erasure problem.

However, the greatest drawback of such split-gate design is the fact that a reduced number of program/erase cycles are allowed. This reduction is due to the fact that floating gate (130') of this split-gate memory cell configuration is only provided near the drain region (113'), which results in different mechanisms occurring for the programming and erasing operations of the device. That is, electron passage must be via a sequence of drain (113') and through tunneling oxide layer (120'), and the resulting reduction of allowable program/erase cycles renders the device suitable only for those applications requiring a relatively few number of program/erase cycles during the entire life span of the device.

To program the transistor shown in FIG. 2b, charge is transferred from substrate (100) through gate oxide (120') and is stored on floating gate (130') of the transistor. The amount of charge is set to one of two levels to indicate whether the cell has been programmed "on" of "off." "Reading" of the cell's state is accomplished by applying appropriate voltages to the cell source (115') and drain (113'), and to control gate. (150'), and then sensing the amount of charge on floating gate (130'). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim (F-N) tunneling mentioned above. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of (F-N) tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Usually a thickness of between about 80 to 120 Angstroms is required to facilitate F-N tunneling.

The thicknesses of the various portions of the oxide layers on the split-gate side (between the control gate and the source) and the stacked-side (between the floating gate and the drain) of the memory cell of FIG. 2b play an important role in determining such parameters as current consumption, coupling ratio and the memory erase-write speed. In prior art, various methods have been developed to address these parameters. For example, in U.S. Pat. No. 5,716,865 Ahn uses a thick insulation film between the tunneling region and the channel region in an EEPROM split-gate flash memory cell in order to prevent the degradation of the tunnel oxide film due to the band-to-band tunneling and the secondary hot carriers which are generated by a high electric field formed at the overlap regions between the junction region and the gate electrode when programming and erasure operations are performed with high voltage.

Wang, in U.S. Pat. No. 5,597,751 shows a method of preventing shorting between a floating gate and a source/drain region of a substrate by depositing a thick spacer oxide layer on top of the floating gate and the source/drain region to a sufficient thickness such that electrical insulation is provided therebetween.

Fahey, et al., on the other hand, disclose a method of forming shallow trench isolation by using a nitride liner with a thickness less than 5 nanometers (nm) in order to prevent the formation of unacceptable voids in the trench. The present invention discloses a different method of fabricating a split-gate memory device with a self-aligned isolation of a non-smiling structure to affect better performance.

SUMMARY OF THE INVENTION

It is therefore an object of this invention to provide a method of forming a split-gate flash memory having a shallow trench isolation with a "non-smiling" structure.

It is an overall object of this invention to provide a split-gate flash memory cell having a shallow trench isolation with a "non-smiling" structure, reduced size, and increased coupling between the floating gate and the source.

These objects are accomplished by providing a semiconductor substrate; forming a gate oxide layer over said substrate; forming a first polysilicon layer over said gate oxide layer; forming a pad oxide layer over said first polysilicon layer; forming a first nitride layer over said pad oxide layer; forming and patterning a first photoresist layer over said first nitride layer to define active regions in said substrate; forming a trench in said substrate by etching through patterns in said first photoresist layer; removing said first photoresist layer; forming a first conformal lining on the inside walls of said trench; forming a second conformal lining over said first conformal lining a second conformal lining over said first conformal lining on the inside walls of said trench; depositing isolation oxide inside said trench to from shallow trench isolation (STI); performing chemical-mechanical polishing of said substrate; removing said first nitride layer; removing said pad oxide layer; forming second nitride layer over said substrate; forming and patterning a second photoresist layer over said second nitride layer to define floating gate; etching through patterns in said second photoresist layer to form openings in said second nitride layer exposing portions of said first polysilicon layer; removing said second photoresist layer; performing thermal oxidation of exposed said portions of said first polysilicon layer through said openings in said second nitride layer to form polyoxide hard mask; removing said second nitride layer; etching said first polysilicon layer using said polyoxide as a hard mask; forming intergate oxide layer; forming a second polysilicon layer over said intergate oxide layer; forming and patterning a third photoresist layer over said second intergate oxide layer to define control gate; and etching through said patterning in third photoresist layer to complete the forming of said split-gate flash memory.

These objects are further accomplished by providing a split-gate flash memory cell having appropriate gate oxide thicknesses between the substrate and the floating gate and between the floating gate and the control gate along with an extra thin nitride layer lining the inside walls of the shallow trench isolation (STI) in order to overcome the problems of low data retention capacity and reduced capacitive coupling of a conventional cell.

BRIEF DESCRIPTION OF THE DRAWINGS

FIG. 1a is a cross-sectional view of a conventional split-gate flash memory cell.

FIG. 1b shows the forming of the "smiling" effect of the conventional cell of FIG. 1a.

FIG. 1c is a cross-sectional view of a split-gate flash memory cell showing the forming of the "smiling" effect in a shallow trench isolation (STI) of prior art.

FIG. 2a shows a stacked-gate type memory cell of prior art.

FIG. 2b shows another split-gate type memory cell of prior art.

DESCRIPTION OF THE PREFERRED EMBODIMENTS

Figure 3A:
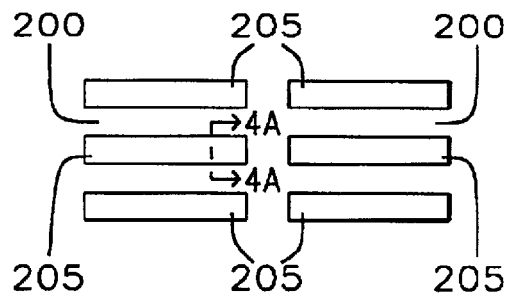
FIG. 3a is a top view of a semiconductor substrate showing the forming of an STI according to the present invention.

Referring now to the drawings, specifically to FIGS. 3a–3e, and to FIGS. 4a–4g, there is shown a method of forming a split-gate flash memory having a shallow trench isolation without the "smiling" structure of conventional cells. This makes possible further shrinking of the lateral dimensions of a memory cell in addition to the scaling of the vertical dimension of a shallow trench for ultra scale integration of semiconductor devices. The top views of the disclosed structure are shown FIGS. 3a–3e while FIGS. 4a–4g show the various cross-sectional views of the corresponding structure.

Figure 4A:
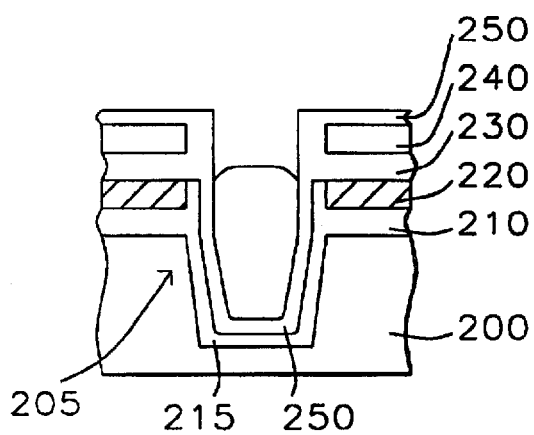
FIG. 4a is a cross-sectional view of the substrate of FIG. 3a showing the two conformal layers lining the STI of this invention.

FIG. 3a shows top view of a semiconductor substrate (200) where trenches (205) are to be formed. A cross-sectional view of a trench is shown in FIG. 4a. First, a layer of gate oxide (210), better seen in the cross-sectional view, is formed over the substrate by thermally growing the oxide at a temperature between about 800 to 1100° C., and preferably to a thickness between about 70 to 110 angstroms (Å)

Next, first polysilicon layer (220), later to be formed into a floating gate, is deposited over the gate oxide later. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 500 to 650° C. The preferred thickness of the first polysilicon layer (220) is between about 800 to 1500 Å. This is followed by the forming of pad oxide layer (230) which is to cushion, as is known in the art of LOCOS (Local Oxidation of Silicon), the transition of stresses between the polysilicon layer (220) and the nitride layer (240) to be deposited subsequently. Pad oxide layer may be formed by using chemical CVD $SiO_2$, but it is preferred that it be grown thermally at a temperature range between about 900 to 1100° C., and to a thickness between about 100 to 250 Å.

A first nitride layer (240) is then formed over pad oxide layer (230) by reacting dichlorosilane ($SiCl_2H_2$) with ammonia ($NH_3$) in an LPCVD preferably at a temperature between about 720 to 820° C. The active regions in the substrate are now defined with a photolithographic step. A first photoresist layer (not shown) is patterned to protect all of the areas where active devices are to be formed. First nitride layer (240) is then dry etched using recipe comprising gases $SF_6$, $O_2$, and HBr, and the pad oxide layer is etched by means of either a dry—or wet—etch. This is followed by forming a shallow trench in the silicon substrate by using a recipe comprising gases $Cl_2$ and HBr as shown in FIG. 4a. After forming the trench, first photoresist layer is removed by oxygen plasma ashing.

At the next step, and as a main feature and key aspect of the present invention, trench (205) is lined with two thin conformal layers. First conformal layer comprises oxide and is thermally grown to a thickness of between about 200 to 550 Å at a temperature range between about 850 to 1000° C. The second conformal layer comprises nitride and has only a thickness between about 100 to 300 Å. It will be appreciated by those skilled in the art that, at a later step of oxidizing the first polysilicon layer to form the floating gate of the memory cell, the presence of the second conformal nitride layer in the trench will prevent the oxidizing species from reaching the polysilicon surface to cause "smiling" effect as was shown in FIG. 1c. This is because oxygen and water vapor diffuse very slowly through silicon nitride and nitride itself oxidizes very slowly. In a first embodiment of this invention, the nitride layer remains as an integral part of the structure as shown in FIG. 4a. In the second embodiment, the conformal nitride layer is etched to form nitride spacers (not shown).

Figure 3D:
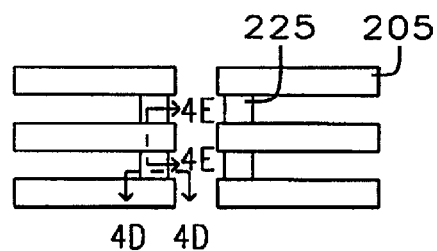
FIG. 3d is a top view showing the forming of the polyoxide over the floating gate of the substrate of FIG. 3c of this invention.
Figure 3B:
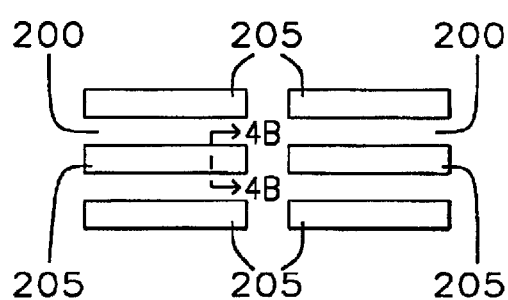
FIG. 3b is a top view showing the forming of a nitride layer over the substrate of FIG. 3a of this invention.
Figure 3E:
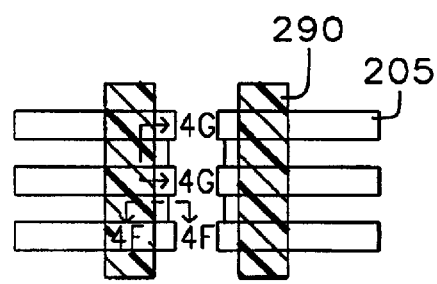
FIG. 3e is a top view showing the control gate patterning of the substrate of FIG. 3d of this invention.
Figure 3C:
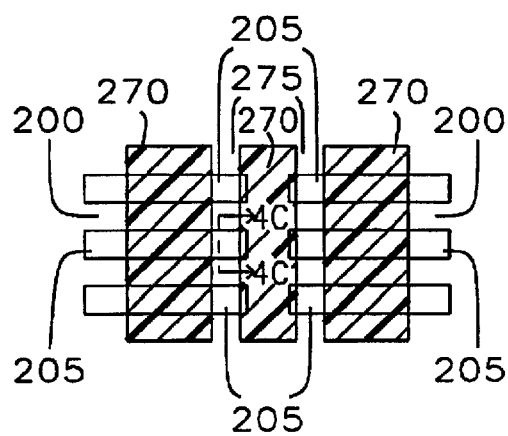
FIG. 3c is a top view showing the floating gate patterning of the substrate of FIG. 3b of this invention.
Figure 4B:
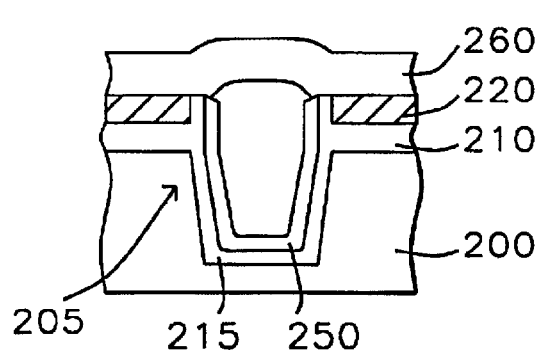
FIG. 4b is a cross-sectional view of the substrate of FIG. 3b showing the forming of a nitride layer according to this invention.
Figure 4E:
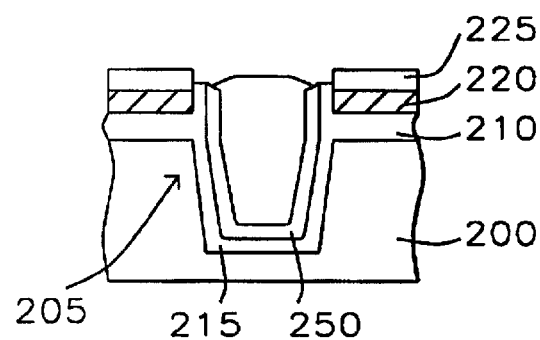
FIG. 4e is a cross-sectional view of the substrate of FIG. 3d showing the STI of this invention with a "non-smiling" structure.
Figure 4C:
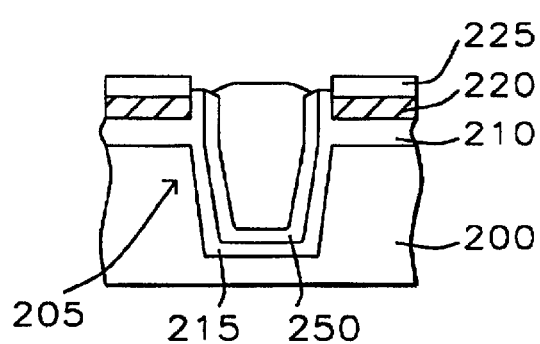
FIG. 4c is a cross-sectional view of the substrate of FIG. 3c showing the forming of the polyoxide tops according to this invention.

With the two conformal layers lining the interior walls therefore, isolation oxide is next deposited into trench (205) using chemical vapor deposition to a thickness between about 4000 to 6000 Å. As another key step, first nitride layer (240) is removed by dry etching with gas $SF_6$ and so is the pad oxide layer (230). Subsequently, a second blanket nitride layer (260) is deposited as shown in FIG. 4b by reacting dichlorosilane ($SiCl_2H_2$) with ammonia ($NH_3$) in an LPCVD preferably at a temperature between about 750 to 850° C. FIG. 4b is a cross section of the substrate shown in FIG. 3b. Then, a second photoresist layer, (270), is next formed and patterned to define the floating gate regions over the substrate as shown in FIG. 3c. The pattern openings, (275), are dry etched into the second nitride layer until the underlying polysilicon layer (220) is exposed. First polysilicon layer (220) is better seen in FIG. 4c. The exposed first polysilicon layer in the floating gate pattern openings in the second nitride layer are next oxidized in a wet environment and at a temperature between about 850 to 1000° C. to form poly-oxide "tops" (225) shown in FIG. 4c, with a preferred thickness between about 1000 to 1800 Å. It is important to note here that, as a result of the main feature of having conformal layers (225) and (250) in trench (205), the "smiling" effect that would have otherwise been present has been eliminated. In other words, the oxidizing species have been prevented from reaching the polysilicon and forming the "smiling" structure. Top view of the oxidized tops (225) of the first polysilicon layer are shown in FIG. 3d, and a cross-section of the same in FIG. 4d. Another view of trench (205) is shown in FIG. 4e.

After the poly oxidation, second nitride layer (260) is removed by applying a wet solution of phosphoric acid, $H_3PO_4$. Using the poly-oxide layer as a hard mask, the first polysilicon layer is etched using a recipe comprising HBr, $Cl_2$ gases thus forming polysilicon floating gate (223) as shown in FIG. 3d.

Figure 4F:
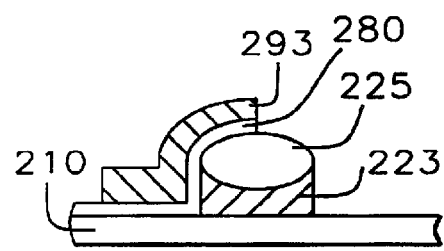
FIG. 4f is a cross-sectional view of the substrate of FIG. 3e showing the split-gate flash memory cell of this invention with a "non-smiling" structure.
Figure 4D:
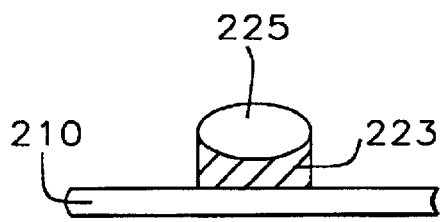
FIG. 4d is a cross-sectional view of the substrate of FIG. 3d showing the floating gate and the polyoxide top, or cap, of this invention.
Figure 4G:
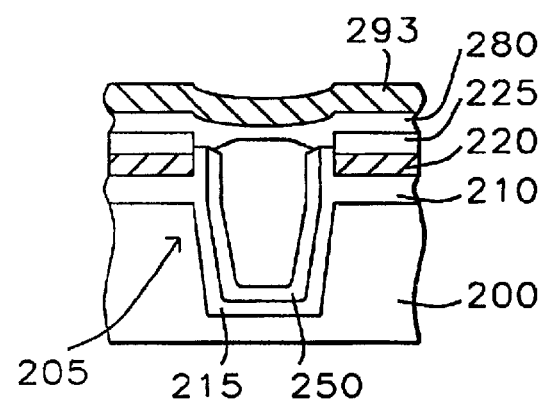
FIG. 4g is a cross-sectional view of the substrate of FIG. 3e showing the STI of this invention with a "non-smiling" structure.

The penultimate step of completing the forming of the split-gate memory cell structure is accomplished first by forming an inter-poly oxide (280) as shown in FIG. 4f. It is preferred that layer (280) is an oxide with a thickness between about 100 to 250 Å. At the final step, a second polysilicon layer is deposited over inter-poly oxide (280) and is patterned with a third photoresist layer (290) shown in FIG. 3e, to form control gate (293), as shown in FIG. 4f. It is preferred that the second polysilicon layer is formed using silicon source $SiH_4$ in an LPCVD chamber at a temperature between about 500 to 650° C., and that it has a thickness between about 1000 to 3000 Å. A cross-sectional view of shallow trench isolation (205) after the completion of the split-gate memory cell is shown in FIG. 4g.

It has been disclosed in the present invention a split-gate flash memory cell having a shallow trench with a "non-smiling" structure and a method directed to forming the same. Though numerous details of the disclosed method are set forth here, such as forming two conformal layers lining the interior walls of the trench, to provide an understanding of the present invention, it will be obvious, however, to those skilled in the art that these specific details need not be employed to practice the present invention, such as, for example, the forming of spacers from the nitride lining. At the same time, it will be evident that the same methods may be employed in other similar process steps, such as, for example, in shrinking cell size further by preventing the formation of the "smiling" structure at the edge of floating gates of prior art.

That is to say, while the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell structure having a trench isolation devoid of the "smiling" effect comprising:
   a substrate;
   a first oxide layer atop said substrate serving an a gate oxide;
   a floating gate atop said first oxide layer;
   a trench formed as a single continuous opening through said floating gate and said first oxide layer and into said substrate, wherein said single continuous opened surfaces of said floating gate, said first oxide layer and said substrate form interior trench walls;
   a first conformal layer lining said interior trench walls, said first conformal layer being in contact with and extending over said continuous surfaces of said flouting gate, said first oxide and said substrate, said first conformal layer comprises oxide;
   a second conformal layer lining said interior trench walls, said second conformal layer being in contact with said first conformal layer and extending over said continuous surfaces of said floating gate, said first oxide and said substrate, said second conformal layer comprises nitride;
   an isolation oxide tilling said trench, wherein said isolation oxide is devoid of said "smiling" effect in proximity to said floating gate;
   a second oxide layer atop said floating gate;
   a third oxide layer atop said isolation oxide filling said trench and atop said second oxide layer atop said floating gate;
   a control gate atop said third oxide layer.

2. The split-gate flash memory cell structure of claim 1, wherein the first conformal layer comprises oxide have a thickness between about 200 Å to 550 Å.

3. The split-gate flash memory cell structure of claim 1, wherein the second conformal layer comprises a thin nitride having a thickness between about 100 Å to 300 Å.

4. The split-gate flash memory cell structure of claim 1, wherein said second oxide layer comprises poly-oxide having a thickness of between 1000 Å and 1800 Å.

5. The split-gate flesh memory cell structure of claim 1, wherein said first oxide layer thickness is between 70 Å and 110 Å.

6. The split-gate flash memory cell structure of claim 1, wherein said floating gate comprises polysilicon having a thickness of between 800 Å and 1500 Å.

7. The split-gate flash memory cell structure of claim 1, wherein said isolation oxide thickness is between 4000 Å and 6000 Å.

8. The split-gate flash memory cell structure of claim 1, wherein said third oxide layer thickness is between 100 Å and 250 Å.

9. The split-gate flash memory cell structure of claim 1, wherein said control gate comprises polysilicon having a thickness of between 1000 Å and 3000 Å.

* * * * *